United States Patent
Liu et al.

(10) Patent No.: US 9,608,127 B2
(45) Date of Patent: Mar. 28, 2017

(54) AMORPHOUS OXIDE THIN FILM TRANSISTOR, METHOD FOR MANUFACTURING THE SAME, AND DISPLAY PANEL

(71) Applicant: BOE TECHNOLOGY GROUP CO., LTD., Beijing (CN)

(72) Inventors: Xiaodi Liu, Beijing (CN); Li Sun, Beijing (CN); Haijing Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/800,089

(22) Filed: Jul. 15, 2015

(65) Prior Publication Data

US 2015/0318383 A1      Nov. 5, 2015

Related U.S. Application Data

(62) Division of application No. 13/428,422, filed on Mar. 23, 2012, now Pat. No. 9,112,040.

(30) Foreign Application Priority Data

Mar. 28, 2011    (CN) .......................... 2011 1 0076083

(51) Int. Cl.
*H01L 29/786*    (2006.01)
*H01L 21/02*     (2006.01)
(Continued)

(52) U.S. Cl.
CPC .... *H01L 29/78693* (2013.01); *H01L 21/0273* (2013.01); *H01L 21/02565* (2013.01);
(Continued)

(58) Field of Classification Search
CPC .................................................. H01L 29/7869
See application file for complete search history.

(56) References Cited

U.S. PATENT DOCUMENTS 5,953,595 A    9/1999   Gosain et al.
7,638,360 B2 * 12/2009  Ryu .................... H01L 29/7869
                                                257/43
(Continued)

FOREIGN PATENT DOCUMENTS

CN          1828850 A       9/2006
CN        101740632 A       6/2010
(Continued)

OTHER PUBLICATIONS

Japanese Office Action dated Nov. 16, 2015; Appln. No. 2012-073363.

(Continued)

*Primary Examiner* — Evan Pert
(74) *Attorney, Agent, or Firm* — Ladas & Parry LLP

(57) ABSTRACT

Embodiments of the disclosed technology provide an amorphous oxide thin film transistor (TFT), a method for preparing an amorphous oxide TFT, and a display panel. The amorphous oxide thin film transistor includes: a gate electrode, a gate insulating layer, a semiconductor active layer, a source electrode and a drain electrode. The semiconductor active layer comprises a channel layer and an ohmic contact layer, and the channel layer has a greater content of oxygen than the ohmic contact layer; the channel layer contacts the gate insulating layer, and the ohmic contact layer comprises two separated ohmic contact regions, one of which contacts the source electrode and the other of which contacts the drain electrode.

12 Claims, 5 Drawing Sheets

(51) Int. Cl.
  *H01L 21/027* (2006.01)
  *H01L 21/467* (2006.01)
  *H01L 21/477* (2006.01)
  *H01L 21/441* (2006.01)
  *H01L 29/66* (2006.01)

(52) U.S. Cl.
  CPC .. *H01L 21/02592* (2013.01); *H01L 21/02631* (2013.01); *H01L 21/441* (2013.01); *H01L 21/467* (2013.01); *H01L 21/477* (2013.01); *H01L 29/66969* (2013.01); *H01L 29/78618* (2013.01)

(56) References Cited

U.S. PATENT DOCUMENTS

| | | | | |
|---|---|---|---|---|
| 7,943,985 | B2* | 5/2011 | Kim | H01L 29/7869 257/288 |
| 9,112,040 | B2* | 8/2015 | Liu | H01L 29/78618 |
| 2002/0132385 | A1 | 9/2002 | Dojo et al. | |
| 2006/0110867 | A1 | 5/2006 | Yabuta et al. | |
| 2007/0295963 | A1 | 12/2007 | Yano et al. | |
| 2008/0197350 | A1* | 8/2008 | Park | H01L 29/7869 257/43 |
| 2008/0299702 | A1 | 12/2008 | Son et al. | |
| 2009/0289258 | A1 | 11/2009 | Kim et al. | |
| 2010/0025676 | A1 | 2/2010 | Yamazaki et al. | |
| 2010/0051935 | A1 | 3/2010 | Lee et al. | |
| 2010/0105164 | A1 | 4/2010 | Ito et al. | |
| 2010/0117073 | A1 | 5/2010 | Yamazaki et al. | |
| 2010/0163868 | A1 | 7/2010 | Yamazaki et al. | |
| 2011/0031497 | A1 | 2/2011 | Yamazaki et al. | |
| 2011/0183463 | A1 | 7/2011 | Kim et al. | |
| 2013/0130438 | A1 | 5/2013 | Yamazaki et al. | |

FOREIGN PATENT DOCUMENTS

| | | |
|---|---|---|
| JP | 02-237161 A | 9/1990 |
| JP | 042135 A | 1/1992 |
| JP | 09-153625 A | 6/1997 |
| JP | 10-240150 A | 9/1998 |
| JP | 2004-144826 A | 5/2004 |
| JP | 2010-056540 A | 3/2010 |
| JP | 2010-123937 A | 6/2010 |
| JP | 2010-171404 A | 8/2010 |
| JP | 2010-205932 A | 9/2010 |
| JP | 2011-054946 A | 3/2011 |
| KR | 20000003173 A | 1/2000 |
| KR | 20070121594 A | 12/2007 |
| KR | 20100051544 A | 5/2010 |

OTHER PUBLICATIONS

European Patent Office—Office Action Appln. No. 12 161 178.4-1504; Dated Jul. 31, 2015.
EPO Office Action dated May 13, 2016; Appln. No. 12 161 178.4-1504.
Korean Office Action dated Jan. 16, 2014; Appln. No. 10-2012-0030488.
Korean Notice of Rejection dated Nov. 28, 2013; Appln. No. 10-2012-0030488.
First Chinese Office Action dated Feb. 18, 2014; Appln. No. 201110076083.9.
Second Chinese Office Action dated Jul. 2, 2014; Appln. No. 201110076083.9.
Extended European Search Report dated Jun. 26, 2012; Appln. No. 12161178.4-1528.
EPO Office Action dated Dec. 16, 2014; Appln. No. 12161178.4-1508.
USPTO RR dated Apr. 15, 2013 in connection with U.S. Appl. No. 13/428,422.
USPTO NFOA dated Jun. 20, 2013 in connection with U.S. Appl. No. 13/428,422.
USPTO NFOA dated Jan. 16, 2014 in connection with U.S. Appl. No. 13/428,422.
USPTO NOA mailed Apr. 16, 2015 in connection with U.S. Appl. No. 13/428,422.

* cited by examiner

AMORPHOUS OXIDE THIN FILM TRANSISTOR, METHOD FOR MANUFACTURING THE SAME, AND DISPLAY PANEL

BACKGROUND

Embodiments of the disclosed technology relates to an amorphous oxide thin film transistor, a method for manufacturing an amorphous oxide thin film transistor, and a display panel.

At present, amorphous silicon thin film transistors (TFT) and polysilicon TFTs are widely used in liquid crystal displays. Hydrogenated amorphous silicon (a-Si:H) TFTs have become mainly used for active matrix flat displays due to advantage of simply preparation process, excellent uniformity, or the like. However, a-Si:H TFTs have defects, such as low mobility, poor stability, or the like, and therefore are difficult to be used in the field of large-area AMOLED (Active Matrix Organic Light Emitting Diode). Compared with the amorphous silicon TFTs, the polysilicon TFTs have high mobility and good stability. Methods for preparing a channel portion of a polysilicon TFT mainly include solid phase crystallization (SPC) and excimer laser annealing (ELA). The former relates to a long time high temperature annealing process, so it can not be adopted for a large-area glass substrate; the later has some defects, such as poor uniformity, or the like, so it cannot be adopted for the large-area glass substrate also.

For realizing large-area AMOLED displaying, amorphous oxide TFTs mainly based on zinc oxide (ZnO) or tin oxide ($SnO_2$) are used and combines the advantages of amorphous silicon and polysilicon TFTs, such as high carrier mobility, excellent uniformity, or the like, so this technology has attracted an increasing attention. However, the semiconductor channel made of amorphous oxide usually has high carrier concentration so that the threshold voltage becomes very low, even down to a negative value, that is, even if no gate bias voltage is applied, the device can not be turned-off completely. If the amorphous oxide is used to form the semiconductor channel with low carrier concentration and high resistance, a parasitic resistance of source and drain electrodes may be increased, and thus the current driving capacity is reduced.

SUMMARY

An embodiment of the disclosed technology provides an amorphous oxide thin film transistor (TFT), comprising: a gate electrode, a gate insulating layer, a semiconductor active layer, a source electrode, and a drain electrode, wherein the semiconductor active layer comprises a channel layer and an ohmic contact layer, and the channel layer has a greater content of oxygen than the ohmic contact layer; and wherein the channel layer contacts the gate insulating layer, and the ohmic contact layer comprises two separated ohmic contact regions, one of which contacts the source electrode and the other of which contacts the drain electrode.

Another embodiment of the disclosed technology provides a liquid crystal display panel, comprising: an array substrate, comprising: gate lines and data lines formed on a base substrate and crossing with each other to define pixel units, each pixel unit comprising an amorphous oxide thin film transistor (TFT), which comprises: a gate electrode, a gate insulating layer, a semiconductor active layer, an active electrode, and a drain electrode, wherein the semiconductor active layer comprises a channel layer and an ohmic contact layer, and the channel layer has a greater content of oxygen than the ohmic contact layer; and wherein the channel layer contacts the gate insulating layer, and the ohmic contact layer comprises two separated ohmic contact regions, one of which contacts the source electrode and the other of which contacts the drain electrode.

Still another embodiment of the disclosed technology provides a method for manufacturing an amorphous oxide thin film transistor (TFT) comprising a gate electrode, a gate insulating layer, a semiconductor active layer, a source electrode and a drain electrode, the method comprising:

step a, preparing a channel layer and an ohmic contact layer respectively to form the semiconductor active layer, wherein the channel layer has a greater content of oxygen than the ohmic contact layer; and wherein the channel layer contacts the gate insulating layer, and the ohmic contact layer comprises two separated ohmic contact regions, one of which contacts the source electrode and the other of which contacts the drain electrode.

Further scope of applicability of the disclosed technology will become apparent from the detailed description given hereinafter. However, it should be understood that the detailed description and specific examples, while indicating embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

In order to more clearly describe embodiments of the disclosed technology or solutions in the prior art, drawings for showing the embodiments and the prior art are simply described hereinafter. Apparently, the following described drawings only illustrate some embodiments of the disclosed technology. Those skilled in the art can obtain other drawings based on these drawings disclosed herein without mental work.

DETAILED DESCRIPTION

The embodiments of the disclosed technology will be hereinafter described clearly and completely in connection with the accompany drawings in which the embodiments are shown. Apparently, the described embodiments are only a part of embodiments, but not all embodiments of the disclosed technology. All of other embodiments made by those skilled in the art based on embodiments disclosed herein without mental work fall within the scope of the disclosed technology.

First Embodiment

Figure 1:
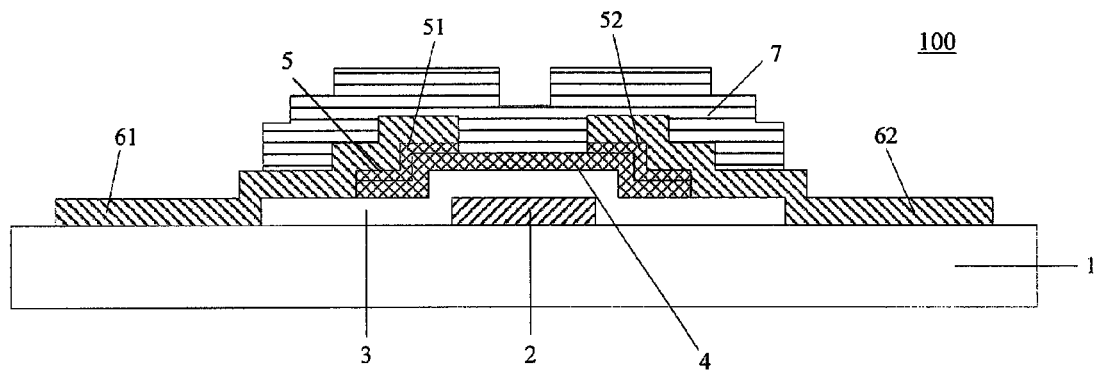
FIG. 1 is a schematic cross-section view of an amorphous oxide TFT according to a first embodiment of the disclosed technology.

As shown in FIG. 1, an embodiment of the disclosed technology provides an amorphous oxide thin film transistor (TFT) 100, comprising a gate electrode 2, a gate insulating layer 3, a semiconductor active layer, a source electrode 61, a drain electrode 62, and a passivation protection layer 7. The semiconductor active layer has a double-layer structure comprising a channel layer 4 and an ohmic contact layer 5, and the channel layer 4 has a higher content of oxygen than the ohmic contact layer 5. The amorphous oxide TFT 100 is formed on a base substrate 1.

The channel layer 4 is provided on and contacts the gate insulating layer 3. The ohmic contact layer 5 includes two separated ohmic contact regions 51 and 52 which respectively contact the source electrode 61 and the drain electrode 62.

The channel layer 4 is formed by sputtering amorphous oxide material in oxygen-contained atmosphere, which may be oxygen-argon mixture gas having $O_2$/Ar pressure ratio of 0%~30%, and the ohmic contact layer 5 is formed by sputtering amorphous oxide material in non-oxygen atmosphere, which may be pure argon gas. The amorphous oxide material may be zinc oxide (ZnO) based or tin dioxide ($SnO_2$) based oxide. In particular, the amorphous oxide material may be at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

In the amorphous oxide TFT of the embodiment of the disclosed technology, the channel layer and the ohmic contact layer form a double-layered semiconductor active layer, and the channel layer has a greater content of oxygen than the ohmic contact layer. Since the greater the oxygen content corresponds to the higher the resistance, and the ohmic contact layer has a lower content of oxygen than the channel layer, the resistance of the ohmic contact layer is smaller than that of the channel layer. Also, since the ohmic contact layer respectively contacts the source and drain electrodes, the parasitic resistance of the source and drain electrodes is reduced, so that the current driving capacity is improved.

Embodiments of the disclosed technology also provide a method for manufacturing the above amorphous oxide TFT. The method includes the following steps: during preparing the semiconductor active layer, preparing the channel layer 4 and the ohmic contact layer 5 to form the semiconductor active layer; the channel layer 4 has a greater content of oxygen than the ohmic contact layer 5; the channel layer 4 contacts the gate insulating layer 3, the ohmic contact layer 5 comprises two separated ohmic contact regions 51 and 52 which contact the source electrode 61 and drain electrode 62, respectively. That is, the ohmic contact region 51 contacts the source electrode 61, and the ohmic contact region 52 contacts the drain electrode 62.

In one example, a method for manufacturing an amorphous oxide TFT includes the following steps.

Figure 2:
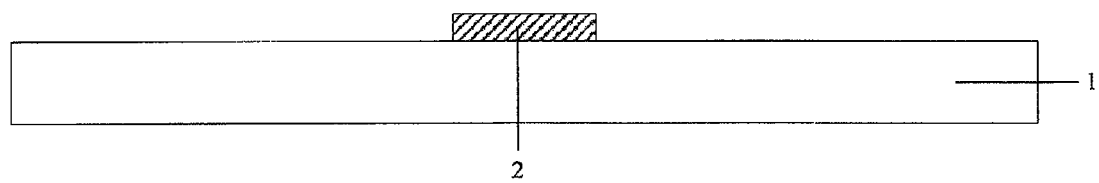
FIGS. 2~12 illustrate main steps for preparing the amorphous oxide TFT shown in FIG. 1, wherein the step shown in FIG. 4 can be replaced by the steps shown in FIGS. 7~9.

Step 101, as shown in FIG. 2, preparing a gate metal thin film on a base substrate 1, and forming a gate electrode 2 by a photolithographic process.

For example, deposited is a Mo layer, a double metal layer of Al and Nd, a double metal layer of Au and Ti, or an alloy layer on the base substrate 1, such as a glass, silicon, or polyethylene terephthalate substrate, by a sputter process, to form a gate metal thin film; and the gate metal thin film is patterned by the photolithographic process to form the gate electrode 2 of a TFT.

The photolithographic process may include photoresist coating, exposing, developing, etching, photoresist removing, etc. A kind of positive photoresist is an example of the photoresist used in the embodiment. The exposed portion of the positive photoresist is removed in the developing process, and the unexposed portion is remained. In process, a kind of negative photoresist is contrary to the positive photoresist.

Figure 3:
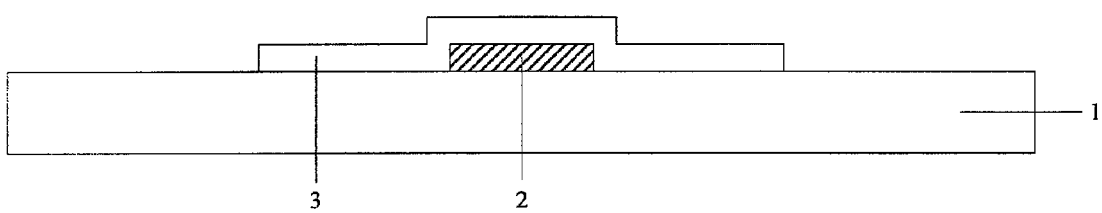

Step 102, as shown in FIG. 3, forming a gate insulating layer 3 on the base substrate after step 101, and patterning the gate insulating layer 3.

For example, the gate insulating layer made of at least one selected from SiOx, $Si_3N_4$, AlOx, TiOx, and $HfO_2$ by a thermal growing method, a plasma chemical vapor deposition method, or a sputtering method; or, the gate insulating layer made of at least one of AlOx, TiOx, and $HfO_2$ is formed by firstly sputtering at least one of Al, Ti, and Hf or another metal and then performing an oxygen-plasma treating process;

In addition, after the gate insulating layer is prepared, the gate insulating layer can be patterned by a photolithographic process. Thus, it may avoid the defects, such as poor contact and breaking wires caused in the preparation of via holes and wirings, and the production efficiency and the yield can be improved.

Step 103, annealing the substrate after step 102 in nitride, oxygen, or vacuum atmosphere, wherein the annealing temperature is about 350° C.~400° C.

In the present embodiment, the temperature of the annealing process may be conducted at about 400° C.

After the annealing process, unstable surface state and interface state of the gate insulating layer, such as defect state and dangling bonds, can be reduced, so drift of the threshold voltage of the device can be reduced to a certain degree, and a long term stability of the device is improved. In addition, distinguished from the conventional preparation method that only uses a post annealing process, the annealing process in the embodiment is performed after forming of the gate insulating layer and before forming of the semiconductor active layer in the present embodiment. Thus, an influence on the characteristics of semiconductor active layer, such as chemical composition ratio, can be avoided, and the annealing effect can be enhanced.

Step 104, preparing a channel layer 4 and an ohmic contact layer 5 to form the semiconductor active layer, wherein the channel layer 4 has a greater content of oxygen than the ohmic contact layer 5.

In an example, step 104 may include the following sub steps.

Figure 4:
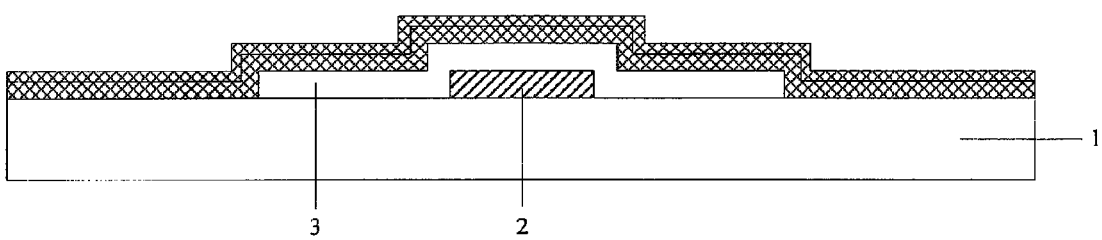

Step a11, as shown in FIG. 4, sputtering an amorphous oxide material on the substrate in oxygen-contained atmosphere to form a first semiconductor active thin film; sputtering an amorphous oxide material in non-oxygen atmosphere to form a second semiconductor active thin film.

The oxygen-contained atmosphere may be oxygen-argon mixture gas having $O_2$/Ar pressure ratio of 0%~30%, and the non-oxygen atmosphere may be pure argon gas. The amorphous oxide material may be zinc oxide (ZnO) based or tin dioxide ($SnO_2$) based oxide. For example, the amorphous oxide material may be at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

For example, the first and second semiconductor active thin films may be formed by sequentially sputtering the amorphous oxide material in oxygen-argon mixture gas and pure argon gas, respectively.

Figure 5:
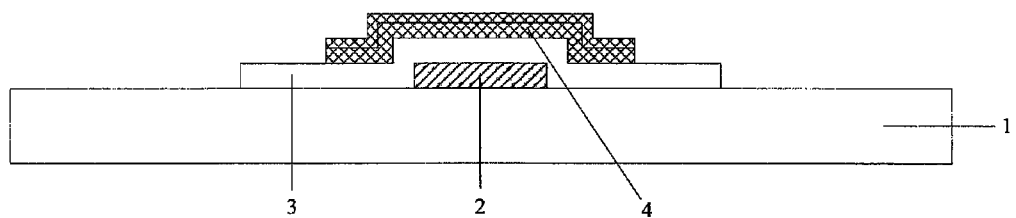

Step a12, as shown in FIG. 5, patterning the first and second semiconductor active thin films on the base substrate after step a11 by a photolithographic process to form the channel layer 4.

In the photolithographic process, a kind of positive photoresist is used, and the etching process in this photolithographic process may be conducted by a wet etching.

Figure 6:
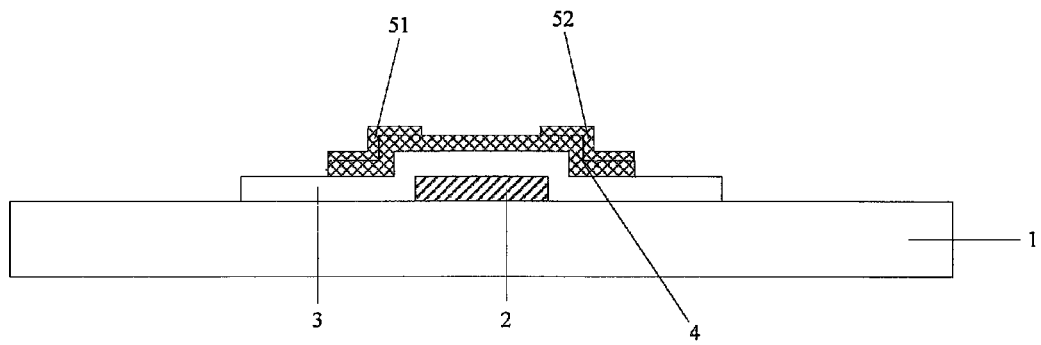

Step a13, as shown in FIG. 6, patterning the second semiconductor active thin film on the base substrate after step a12 by a photolithographic process, to form the ohmic contact layer having two separated ohmic contact regions 51 and 52.

In this photolithographic process, the etching process may be dry etching.

Or, the doubled layered semiconductor active layer may be formed by sputtering amorphous oxide on the substrate having the photoresist and then conducting a photoresist lifting-off process. This method will be described in detail as follow.

In one example, step 104 may include the following sub-steps.

Figure 7:
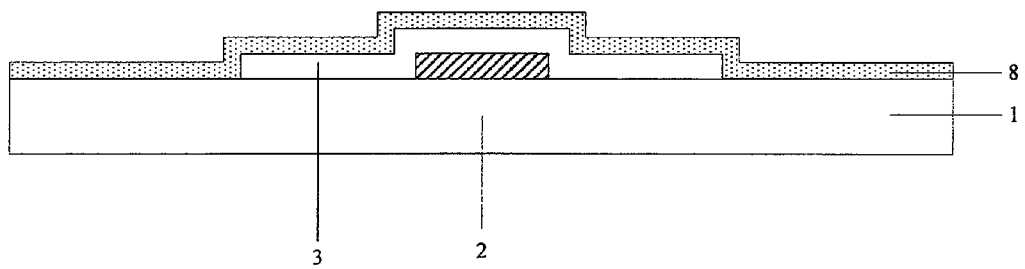
Figure 8:
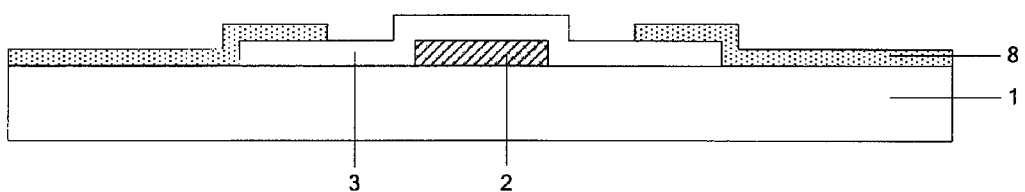

Step a20, as shown in FIG. 7, coating a photoresist layer 8 on the base substrate after step 103, and then exposing and removing (or developing) a portion of the photoresist layer 8 in the channel region, as shown in FIG. 8.

The exposing process in this step and the exposing process in the step a12 may use the same mask plate. The photoresist coated in this step is a kind of negative photoresist.

Figure 9:
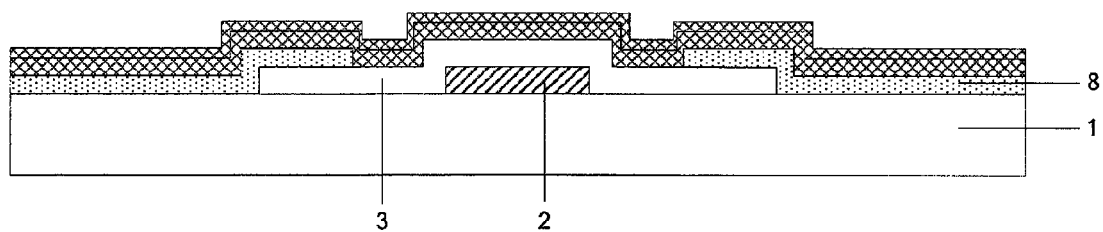

Step a21, as shown in FIG. 9, sputtering amorphous oxide material on the base substrate after step a20 in oxygen-contained atmosphere to form the first semiconductor active thin film; sputtering amorphous oxide material in non-oxygen atmosphere to form the second semiconductor active thin film.

The oxygen-contained atmosphere may be oxygen-argon mixture gas having $O_2/Ar$ pressure ratio of 0%~30%, and the non-oxygen atmosphere may be pure argon gas.

Step a22, lifting-off the remaining photoresist and portions of the first and second semiconductor active thin film corresponding to the remaining photoresist on the base substrate after step a21, to form the channel layer 4; the resultant substrate is shown in FIG. 5.

Step a23, patterning the second semiconductor active thin film on the base substrate after step a22 by a photolithographic process, to form the ohmic contact layer having two separated ohmic contact regions.

At this time, the resultant substrate is shown in FIG. 6.

Step 105, preparing the source and drain electrodes 61 and 62.

Figure 10:
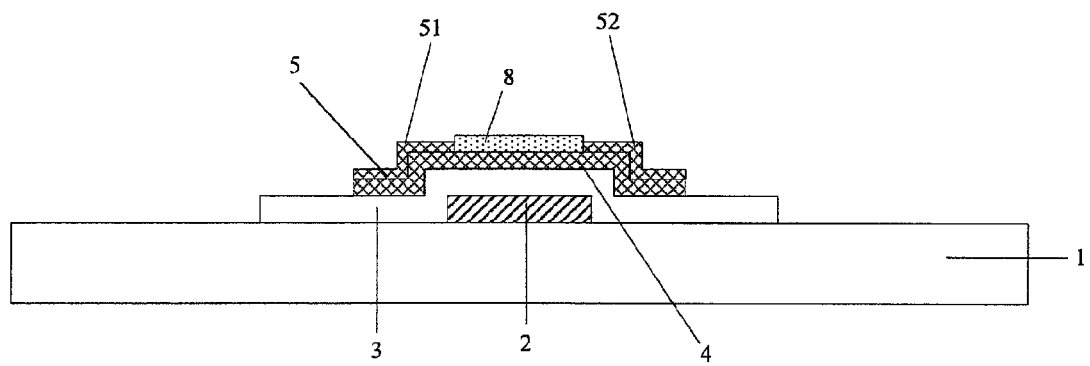

An example of Step 105 may include:

Step b21, as shown in FIG. 10, coating photoresist on the base substrate after step 104, and then exposing and removing the photoresist to remain a portion of the photoresist 8 between two separated ohmic contact regions.

The mask plate used in the exposing process of this step may be same as that used in the exposing process of the step a13 or the step a23. The photoresist used in the photolithographic process of step a13 or step a23 may be a kind of positive photoresist, and the photoresist used in this step may be a kind of negative photoresist. Since the provision of the mask plate is reduced, the production cost may be decreased.

The reasons for performing this step include that the photoresist can protect the channel layer from the damage in the sequence processes.

Step b23, treating the surface of the ohmic contact regions by using Ar plasma, etc.

For example, the surface is treated with Ar plasma, etc. In this step, Ar plasma, etc. have different bombardment effect on different compositions of the channel material, e.g., the different effect on breaking of Ga—O bond, In—O bond, or Zn—O bond, so the material characteristic of the ohmic contact region can be changed and the contact characteristics of the ohmic contact region is improved. Further, the contact characteristics is further improved by increasing the surface roughness of the channel contact region.

Figure 11:
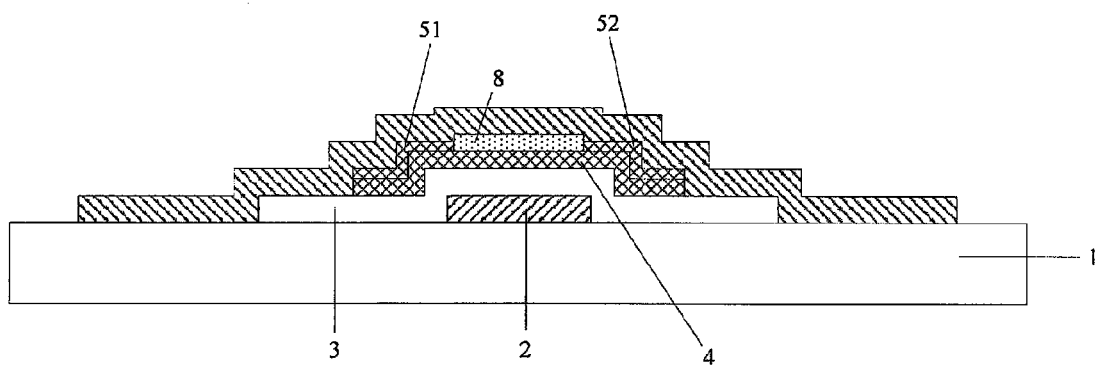
Figure 12:
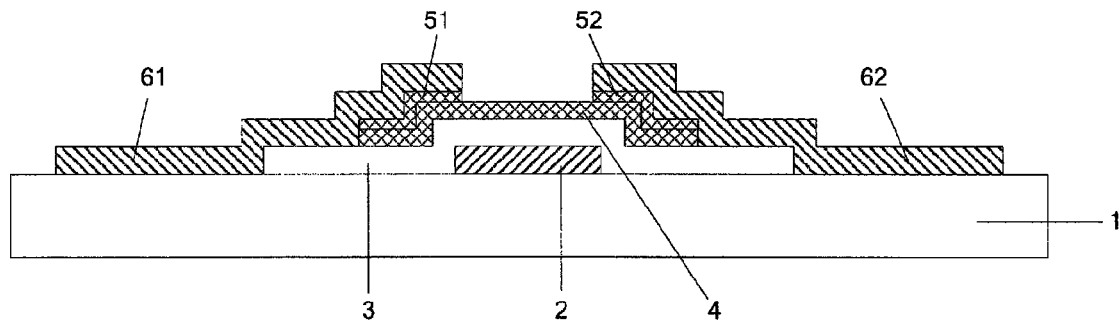

Step b22, as shown in FIG. 11, preparing the source and drain metal thin film, and forming the source and drain electrodes 61 and 62 by a lifting-off process, as shown in FIG. 12.

In this step, the source and drain metal thin film is formed by sputtering a Mo layer, a double metal layered of Al and Nd, a double metal layered of Au and Ti, or an alloy layer, and then is patterned in a lifting-off process to form the source and drain electrodes 61 and 62 of a TFT. If the metal thin film positioned in other region except for the channel region is required to be lift off, e.g., the source and drain electrodes are desired to be electrically isolated from other components on the substrate 1, the photoresist should be remained in the position where these components are located.

Step 106, forming a passivation protection layer 7, as shown in FIG. 1. The passivation protection layer 7 for example may be a silicon oxide layer, a double-layer of silicon oxide and polymethylmethacrylate (PMMA), a double-layer of silicon oxide and polyimide (PI), a triple-layer of silicon oxide, silicon nitride, and PI, or a triple-layer of silicon oxide, silicon nitride, and silicon oxide, etc., by a plasma chemical vapor deposition process.

Step 107, post-annealing the resultant structure. For example, the post-annealing process may be performed in vacuum, nitride gas, or oxygen gas atmosphere, under a temperature of 120° C.~400° C.

In the method for manufacturing the amorphous oxide TFT of the embodiments, the parasitic resistance of the source and drain electrode can be reduced by the formation of the ohmic contact layer with small resistance. Further, the annealing process is performed after preparing of the gate insulating layer and before forming of the semiconductor active layer, so that the unstable surface state and the interface state of the device is reduced, the threshold voltage drift of the device is thus decreased, and the stability of the device is improved. The channel layer is protected by preparing of the etching protection layer, so that the damage to the channel layer, which is caused by the photolithographic process during forming of the source and drain electrodes in the sequence procedures, can be avoided. The source and drain electrodes are formed by sputtering of the source and drain metal layer on the substrate having the photoresist thereon and then performing the lithographic process, so that the damage to the channel layer, which is caused by the photolithographic process during forming of the source and drain electrodes in the sequence procedures, can be avoided. The treatment onto the surface of the ohmic contact region by using Ar plasma or the like can modify the surface characteristic, optimize the contact characteristics between the ohmic contact region and the source and drain electrodes, and further improve the device performance.

In addition, the above amorphous oxide TFT can be used in a display apparatus, e.g., the liquid crystal display (LCD) panel. In one example, the liquid crystal display panel includes pixel units defined by gate lines and data lines, and the amorphous oxide TFT can provided in each the pixel units as a switching element. The structure of the amorphous oxide TFT is shown in FIG. 1. The amorphous oxide TFT includes the gate electrode 2, the gate insulating layer 3, the semiconductor active layer, the source electrode 61, the drain electrode 62, and the passivation protection layer 7. The semiconductor active layer has a double-layered structure of the channel layer 4 and the ohmic contact layer 5. The channel layer 4 has a greater content of oxygen than the ohmic contact layer 5.

The channel layer 4 contacts the gate insulating layer 3. The ohmic contact layer 5 comprises two separated ohmic contact regions 51 and 52 corresponding to the source electrode 61 and the drain electrode 62, respectively.

The channel layer 4 is formed by sputtering an amorphous oxide material in oxygen-contained atmosphere, which may be oxygen-argon mixture gas having $O_2$/Ar pressure ratio of 0%~30%, and the ohmic contact layer 5 is formed by sputtering the amorphous oxide material in non-oxygen atmosphere, which may be pure argon gas. The amorphous oxide material may be zinc oxide (ZnO) based or tin dioxide ($SnO_2$) based oxide. For example, the amorphous oxide material may be at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

The liquid crystal display panel of the embodiment of the disclosed technology having the above amorphous oxide TFT can reduce the parasitic resistance of the source and drain electrodes of TFT, so that the current driving capacity can be improved.

Second Embodiment

Figure 13:
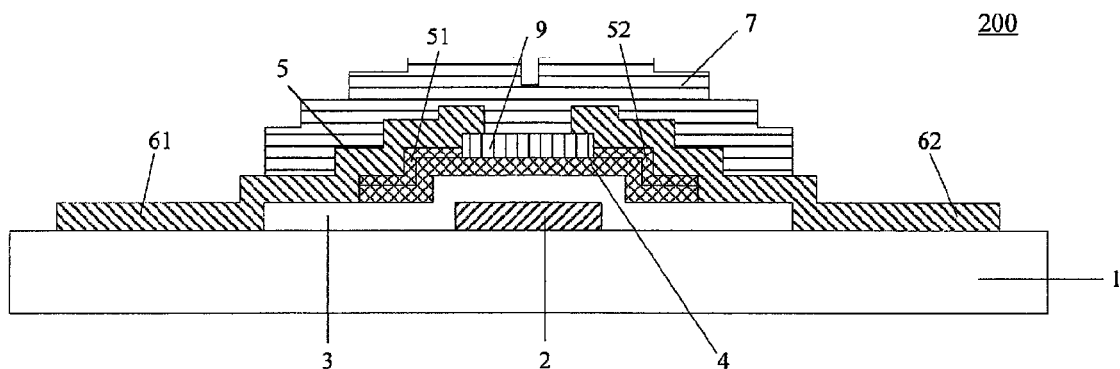
FIG. 13 is a schematic cross-section view of an amorphous oxide TFT according to a second embodiment of the disclosed technology.

As shown in FIG. 13, another embodiment of the disclosed technology provides another kind of amorphous oxide TFT 200, which comprises a gate electrode 2, a gate insulating layer 3, a semiconductor active layer, a source electrode 61, a drain electrode 62, and a passivation protection layer 7. The semiconductor active layer has a double-layered structure comprising a channel layer 4 and an ohmic contact layer 5, and the channel layer 4 has a greater content of oxygen than the ohmic contact layer 5.

The channel layer 4 is provided on and contacts the gate insulating layer 3. The ohmic contact layer 5 comprises two separated ohmic contact regions 51 and 52 which respectively contact the source electrode 61 and the drain electrode 62.

An etching protection layer 9 is formed between the two separated ohmic contact regions 51 and 52, and located between the channel layer 4 and the passivation protection layer 7.

The channel layer 4 is formed by sputtering amorphous oxide material in oxygen-contained atmosphere, which may be oxygen-argon mixture gas having $O_2$/Ar pressure ratio of 0%~30%, and the ohmic contact layer 5 is formed by sputtering amorphous oxide material in non-oxygen atmosphere, which may be pure argon gas. The amorphous oxide material may be zinc oxide (ZnO) based or tin dioxide ($SnO_2$) based oxide. In particular, the amorphous oxide material may be at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

The etching protection layer can protect the channel layer from the damage in the process of patterning the source and drain electrodes, so the device performance can be improved.

The embodiment of the disclosed technology also provides a method for manufacturing the amorphous oxide TFT as shown in FIG. 13, which is same as the method provided in the first embodiment except for step 105. Thus, only step 105 is described in details hereinafter, and other steps can be referred to the first embodiment.

Figure 14:
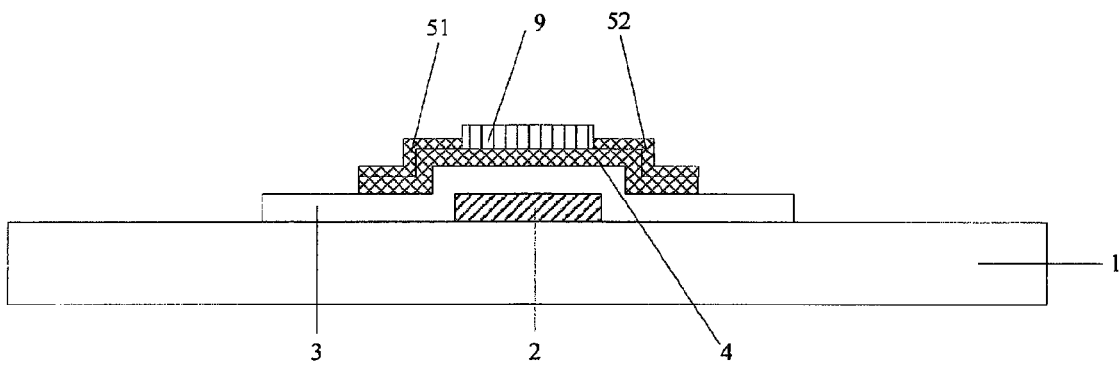
FIGS. 14~15 illustrate steps for preparing an etching protection layer and source and drain electrodes.

In the embodiment of the disclosed technology, step 105 may include:

Step b11, as shown in FIG. 14, preparing an etching protection thin film on the base substrate after step 104, and the forming the etching protection layer 9 by a photolithographic process. The etching protection layer is located between the channel layer 4 and the passivation protection layer 9. The passivation protection layer 9 is prepared with an insulating material.

In one example, an insulating material is deposited on the base substrate after step 104 by plasma chemical vapor deposition or sputter process to form the etching protection thin film, and then the etching protection thin film is patterned by the photolithographic process to form the etching protection layer 9.

The mask plate used in the photolithographic process of this step may be same as that used in the photolithographic process of the step a13 or the step a23. The photoresist used in the photolithographic process of step a13 or step a23 may be a kind of positive photoresist, but in contrast photoresist used in this step may be a kind of negative photoresist. Since the preparation of the mask plate is reduced, the production cost can be decreased.

Step b13, treating the surface of the ohmic contact regions by using Ar plasma, etc.

For example, the surface is treated by Ar plasma, etc. In this step, Ar plasma, etc. have different bombardment effect on different compositions of the channel material, e.g., the different effect on breaking of Ga—O bond, In—O bond, or Zn—O bond, so the material characteristic of the two ohmic contact regions can be modified and the contact characteristics of the ohmic contact region is improved. Further, the contact characteristics can be further improved by increasing the surface roughness of the channel contact region.

Figure 15:
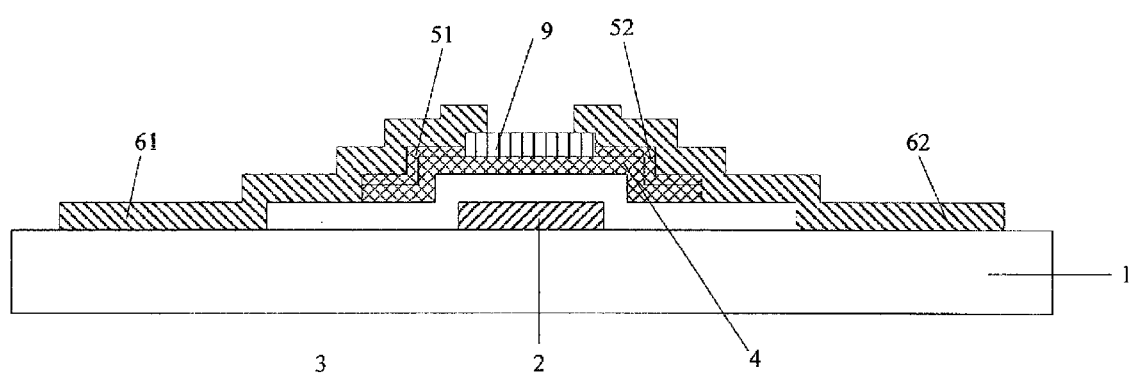

Step b12, as shown in FIG. 15, preparing the source and drain metal thin film, and forming the source and drain electrodes 61 and 62 by a patterning process.

Then, the amorphous oxide TFT as shown in FIG. 13 is completed by performing the sequence processes.

In the method for manufacturing the amorphous oxide TFT of the embodiments, the parasitic resistance of the source and drain electrodes can be reduced by the formation of the ohmic contact layer with small resistance. Further, the channel layer is protected by preparing the etching protection layer, so that the damage to the channel layer, which is caused by the photolithographic process performed in forming the source and drain electrodes in the sequence procedures, can be avoided.

In addition, the above amorphous oxide TFT can be used in the display apparatus, e.g., a liquid crystal display (LCD) panel or an organic light-emitting display (OLED). The liquid crystal display panel includes pixel units defined by gate lines and data lines, and the amorphous oxide TFT is formed in each of the pixel units. The structure of the amorphous oxide TFT is shown in FIG. 13. The amorphous oxide TFT includes the gate electrode 2, the gate insulating layer 3, the semiconductor active layer, the source electrode 61, the drain electrode 62, and the passivation protection layer 7. The semiconductor active layer has a double-layered structure of the channel layer 4 and the ohmic contact layer 5. The channel layer 4 has a greater content of oxygen than the ohmic contact layer 5.

The channel layer 4 contacts the gate insulating layer 3. The ohmic contact layer 5 comprises two separated ohmic contact regions 51 and 52 contacting to the source electrode 61 and the drain electrode 62, respectively.

An etching protection layer 9 is formed between the two separated ohmic contact regions 51 and 52, and located between the channel layer 4 and the passivation protection layer 7.

The channel layer 4 is formed by sputtering amorphous oxide material in oxygen-contained atmosphere, which may be oxygen-argon mixture gas having $O_2/Ar$ pressure ratio of 0%~30%, and the ohmic contact layer 5 is formed by sputtering amorphous oxide material in non-oxygen atmosphere, which may be pure argon gas. The amorphous oxide material may be zinc oxide (ZnO) based or tin dioxide ($SnO_2$) based oxide. For example, the amorphous oxide material may be at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

The liquid crystal display panel of the embodiment of the disclosed technology having the amorphous oxide TFT shown in FIG. 13 also can reduce the parasitic resistance of the source and drain electrodes of a TFT, so that the current driving capacity can be improved.

The above description is only the detail embodiments of the disclosed technology, but the scope of the disclosed technology is not limited thereto. The variations or alternations made by those skilled in the art within the disclosure of the disclosed technology are intended to be included within the scope of the disclosed technology. Therefore, the scope of the disclosed technology is defined by the scope of the claims.

What is claimed is:

1. A method for manufacturing an amorphous oxide thin film transistor (TFT) comprising a gate electrode, a gate insulating layer, a semiconductor active layer, a source electrode and a drain electrode, the method comprising:
    step a, preparing a channel layer and an ohmic contact layer respectively to form the semiconductor active layer,
    wherein the channel layer and the ohmic contact layer are formed of a same amorphous oxide material, and the channel layer has a greater content of oxygen than the ohmic contact layer; and
    wherein the channel layer contacts the gate insulating layer, and the ohmic contact layer comprises two separated ohmic contact regions, one of which contacts the source electrode and the other of which contacts the drain electrode.

2. The method of claim 1, wherein preparing a channel layer and an ohmic contact layer respectively to form the semiconductor active layer, comprising:
    step a11, forming a first semiconductor active thin film by sputtering an amorphous oxide material on a base substrate in oxygen-contained atmosphere, and forming a second semiconductor active thin film by sputtering the amorphous oxide material in non-oxygen atmosphere;
    step a12, patterning the first and second semiconductor active thin films on the base substrate after step a11 to form the channel layer; and
    step a13, patterning the second semiconductor active thin film on the base substrate after step a12 to form the ohmic contact layer which comprises two separated ohmic contact regions.

3. The method of claim 1, wherein preparing a channel layer and an ohmic contact layer respectively to form the semiconductor active layer, comprising:
    step a20, coating a photoresist layer on the base substrate and removing photoresist located in the channel region;
    step a21, sputtering an amorphous oxide material on the base substrate after step a20 in the oxygen-contained atmosphere, to form a first semiconductor active thin film; and sputtering the amorphous oxide material in non-oxygen amorphous to form a second semiconductor active thin film;
    step a22, removing the remaining photoresist and a portion of the first and second semiconductor active thin film corresponding to the remaining photoresist on the base substrate after step a21 by a lifting-off process, to form the channel layer; and
    step a23, patterning the semiconductor active thin film on the base substrate after step a22, to form the ohmic contact layer that comprises two separated ohmic contact regions.

4. The method of claim 2, wherein the amorphous oxide material is zinc oxide (ZnO) based or tin dioxide ($SnO_2$) based oxide.

5. The method of claim 4, wherein the amorphous oxide material is at least one selected from zinc tin oxide (ZTO), indium tin oxide (ITO), zinc indium oxide (ZIO), indium gallium oxide (IGO), indium gallium zinc oxide (IGZO), and aluminum zinc tin oxide (AZTO).

6. The method of claim 5, wherein the oxygen-contained atmosphere is oxygen-argon mixture gas having $O_2/Ar$ pressure ratio of 0%-30%, and the non-oxygen atmosphere is pure argon gas.

7. The method of claim 1, further comprising step b, which in turn comprises:
    step b11, preparing an etching protection thin film on the base substrate after step a, patterning the etching protection thin film o form a etching protection layer, wherein the etching protection layer comprises insulating material; and
    step b12, preparing a source and drain metal thin film, and patterning the source and drain metal thin film to form source and drain electrodes.

8. The method of claim 7, wherein before the step b12 of step b, further comprising:
    step b13, treating a surface of the ohmic contact region with argon plasma.

9. The method of claim 1, further comprising step b, which in turn comprises:
    step b21, coating a photoresist layer on the base substrate after step a, and exposing and developing the photoresist layer to remain a portion of the photoresist between the two separated ohmic contact regions; and
    step b22, preparing a source and drain metal thin film, and forming a source and drain electrodes by a lifting-off process.

10. The method of claim 9, wherein before the step b22 of step b, further comprising:
    step b23, treating a surface of the ohmic contact region with argon plasma.

11. The method of claim 1, before step a, further comprising:
    step u, preparing a gate metal thin film on the substrate, and patterning the gate metal thin film to form a gate electrode; and
    step v, forming a gate insulating layer on the resultant from step u, patterning the gate insulating layer.

12. The method of claim 11, before step a, further comprising:

step w, annealing the substrate after step v in nitride gas, oxygen gas, or vacuum atmosphere, the annealing temperature is 350° C.~400° C.

* * * * *